(12) United States Patent
Canard et al.

(10) Patent No.: US 9,094,026 B2
(45) Date of Patent: Jul. 28, 2015

(54) DIGITAL PHASE-LOCKED LOOP DEVICE WITH AUTOMATIC FREQUENCY RANGE SELECTION

(71) Applicant: Asahi Kasei Microdevices Corporation, Tokyo (JP)

(72) Inventors: David Canard, Colombelles (FR); Sebastien Charpentier, Colombelles (FR); Matthieu Lecuyer, Colombelles (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/273,721

(22) Filed: May 9, 2014

(65) Prior Publication Data

US 2014/0340161 A1    Nov. 20, 2014

(30) Foreign Application Priority Data

May 15, 2013    (EP) .................................... 13305613

(51) Int. Cl.
*H03L 7/085* (2006.01)
*H03L 7/089* (2006.01)
*H03L 7/099* (2006.01)
*H03L 7/093* (2006.01)
*H03L 7/10* (2006.01)
*H03L 7/197* (2006.01)

(52) U.S. Cl.
CPC .............. *H03L 7/0992* (2013.01); *H03L 7/093* (2013.01); *H03L 7/099* (2013.01); *H03L 7/103* (2013.01); *H03L 7/1976* (2013.01); *H03L 2207/06* (2013.01)

(58) Field of Classification Search
CPC ..... H03L 7/0992; H03L 7/1976; H03L 7/103; H03L 7/093; H03L 7/099; H03L 2207/06
USPC ............ 331/1 A, 1 R, 2, 16, 34, 36 C, 46, 49, 331/177 R, 179, DIG. 2; 375/376; 327/150, 327/159
See application file for complete search history.

(56) References Cited

U.S. PATENT DOCUMENTS

| 7,420,427 B2 | 9/2008 | Brown et al. |
| 2010/0097150 A1 | 4/2010 | Ueda et al. |
| 2011/0260762 A1 | 10/2011 | Choi et al. |
| 2012/0074993 A1 | 3/2012 | Chen et al. |

OTHER PUBLICATIONS

Extended European Search Report for European Application No. 13305613.5.

*Primary Examiner* — Arnold Kinkead
*Assistant Examiner* — Richard Tan
(74) *Attorney, Agent, or Firm* — Morgan, Lewis & Bockius LLP

(57) ABSTRACT

A digital phase-locked loop (PLL) device includes a digital loop filter which is provided with both a VCO-loop output and a DCO-loop output. The VCO-loop output is connected to an analog input of a multiband voltage-controlled oscillator (VCO) module for allowing usual operation of the PLL with a direct voltage acting as feedback parameter. The DCO-loop output is connected to a digital control input of the multiband VCO module for allowing automatic frequency range selection. A code value which is produced by the digital loop filter acts as feedback parameter during the frequency range selection. Rapid and precise range selection can thus be performed.

14 Claims, 6 Drawing Sheets

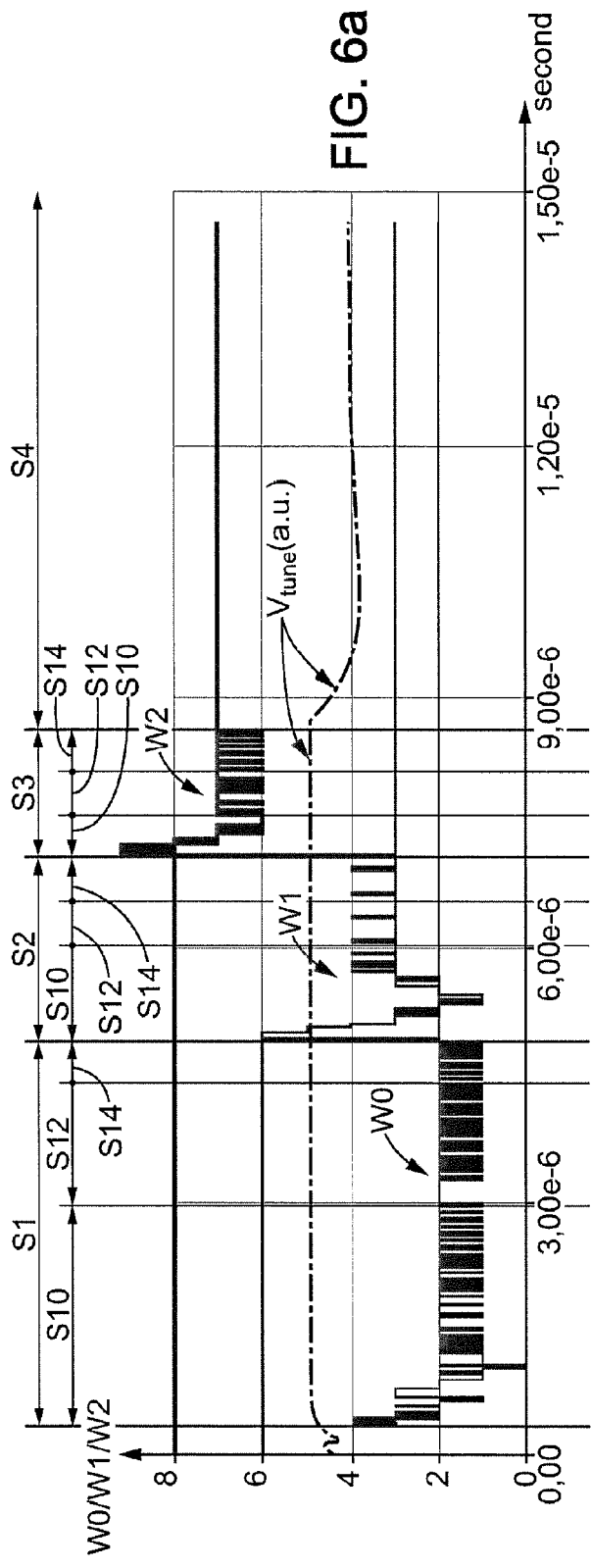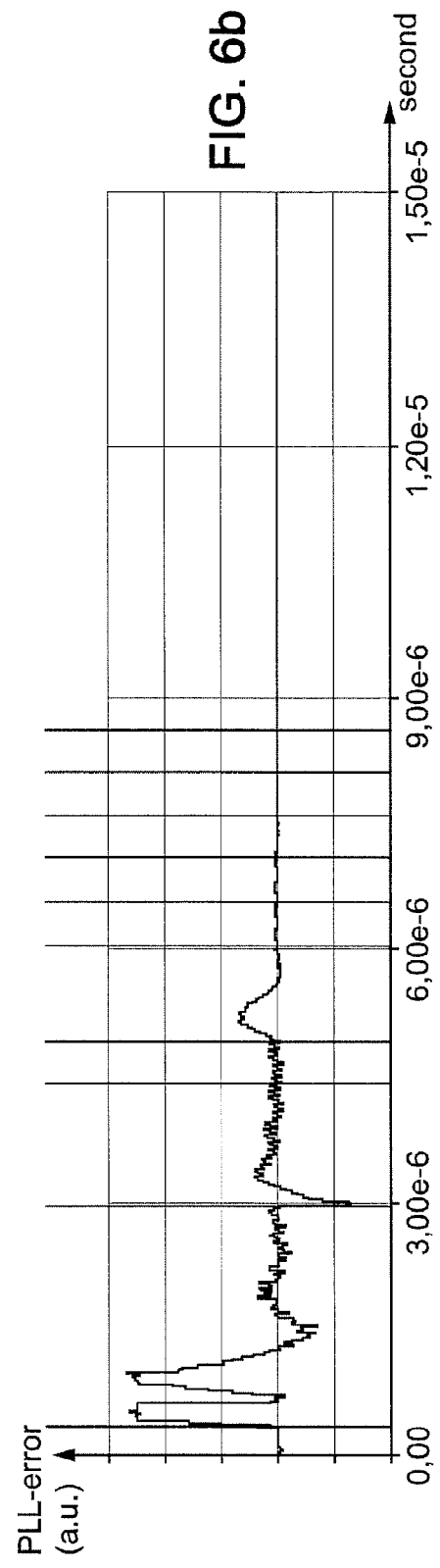

DIGITAL PHASE-LOCKED LOOP DEVICE WITH AUTOMATIC FREQUENCY RANGE SELECTION

This application claims the priority and benefit of EP patent application no. 13305613.5, filed on May 15, 2013, to Asahi Kasei Microdevices Corporation of Japan, entitled "Digital Phase-Locked Loop Device with Automatic Frequency Range Selection," which is hereby incorporated by reference in its entirety.

TECHNICAL FIELD

The invention relates generally to a digital phase-locked loop (DPLL) device with automatic frequency range selection.

BACKGROUND

Phase-locked loops are master devices for providing clock circuits, and have existed in analog or digital versions for a long time. General issues for PLLs include the width of the frequency range of the outputted signal, the lock time and the phase stability.

Commonly, the frequency range is set either by selecting appropriately the voltage-controlled oscillator (VCO) which is used within the PLL, or by controlling a capacitance value for a capacitor tank that is implemented within the VCO module. Implementing digitally-controlled capacitor tanks for such PLL application is well-known. The frequency range is controlled by applying a code value to a digital input of the capacitor tank. Such frequency range control can be user-performed initially, before the PLL starts operating itself by tuning continuously an analog voltage which is applied to the VCO module so as to reduce a signal representative for the PLL error. PLLs which are provided with such range selection are commonly denoted multiband PLLs.

There also exist improved PLL devices, where the code value for selecting the frequency range is automatically produced by an additional circuit part. The range selection is performed automatically without operator intervention, once a frequency target value is supplied to the PLL device. This is very useful in particular in mobile phones, where one and the same PLL is used for clocking radio-signal transmissions each performed within separate transmission bands.

U.S. Patent Publication. No. 2011/260762 and U.S. Pat. No. 7,420,427 disclose such multiband PLL devices with automatic frequency range selection. But in these known implementations, an extra-circuit is added to the PLL for performing the frequency range selection. This extra-circuit increases the overall device complexity and cost. In addition, these PLL devices include a switch for moving from the operation of the extra circuit which performs the frequency range selection, to the usual analog PLL operation. The switching between both operations then generates a phase jump which may cause nuisances to the PLL application.

One object of the present invention is to provide a new PLL device with automatic frequency range selection, which does not have the preceding drawbacks.

Another object of the present invention is to provide a PLL device that automatically performs fast convergence toward the appropriate frequency range once a target frequency value is supplied to the PLL, with convergence time being as short as possible.

Still another object is that the convergence result matches precisely the target frequency value.

Still another object is that an initial frequency range can be preloaded easily, so that the automatic convergence toward the final frequency range is accelerated when compared to using a standard start frequency range which is set independently from the target frequency value.

BRIEF SUMMARY

To achieve these and other objects of the invention, in some embodiments a digital phase-locked loop device with automatic frequency range selection includes a multiband voltage-controlled oscillator module with an output for delivering a VCO signal with a VCO frequency pertaining to one frequency range selected among several frequency ranges available and at least one digital input suitable for selecting the frequency range based on a code value which is received at this digital input, and an analog input suitable for receiving a VCO-control voltage so that each value for the VCO frequency within the selected frequency range is produced for one value of the VCO-control voltage; a frequency converter configured for connecting to the VCO signal and suitable for outputting a phase signal derived from the VCO signal by Q-dividing the VCO frequency (Q being a non-zero division factor); a time-to-digital converter with a first input for receiving a reference phase signal from a reference clock, a second input for receiving the phase signal outputted by the frequency converter, and an output for delivering a digital PLL-error signal; a digital loop filter with an input connected to the output of the time-to-digital converter and a VCO-loop output suitable for delivering a digital VCO-control signal based on a filtering of the digital PLL-error signal as received at the input of the digital loop filter; and, a digital-to-analog converter connected at input to the VCO-loop output of the digital loop filter and connected at output to the analog input of the multiband VCO module, so that the VCO-control voltage is produced based on the digital VCO-control signal.

In some embodiments, the PLL device is of digital type, and in particular because the PLL-error signal and the loop filter are of digital type.

In some embodiments, the digital loop filter further has a DCO-loop output suitable for delivering the code value based on a filtering of the digital PLL-error signal as received at the input of this same digital loop filter.

In some embodiments, the DPLL device includes a lock detector arranged for detecting from the digital PLL-error signal whether a lock condition of the DPLL device is met, and a DCO controller arranged for transmitting the code value to the digital input of the multiband VCO module.

In some embodiments, the DCO controller is adapted for controlling several successive operations of the DPLL device, including at least one frequency range selection operation where the VCO-control voltage is maintained at fixed voltage value and the code value varies until the lock condition is met, and an analog VCO-tuning operation where a final code value corresponding to the meeting of the lock condition is maintained at the digital input of the multiband VCO module and the digital VCO-control signal varies so as to maintain the lock condition.

In some embodiments, in the DPLL device the time-to-digital converter and the digital loop filter are used for both automatically selecting the frequency range and then analog-tuning the VCO module. In some embodiments, the PLL loop including the VCO module, the frequency converter, the time-to-digital converter and the loop filter are operated first for performing the frequency range selection, and thereafter for the PLL operation with analog tuning of the VCO frequency. That is, in some embodiments, the frequency range selection operation and the analog VCO-tuning operation are all executed using only the PLL hardware, simply by re-wiring on-the-fly the outputs of the digital loop filter between both operations. Accordingly, the frequency range selection is performed automatically without an extra-circuit being added for the only purpose of selecting the frequency range.

In some embodiments, because no intervention is required from an operator the PLL device is self-sufficient and the frequency range selection is rapid. In some embodiments, resetting of the digital loop filter can be executed instantaneously at the end of each frequency range selection operation, due to the digital nature of this loop filter, which drastically reduces the overall duration necessary for the range selection.

In some embodiments, due to the frequency range selection being performed with a closed-loop system, convergence is obtained with high precision for the final frequency range.

In some embodiments, the phase jump, which is caused within the outputted VCO signal upon switching from the frequency range selection operation to the analog VCO-tuning operation, is limited as the switching is performed digitally and as such is not marred by analog effects.

In some embodiments, a DPLL device can be easily in-chip integrated, leading to low-cost implementations which are easy to combine with any additional circuit parts, and in particular for forming any application-specific integrated circuit.

In some embodiments, the DCO controller may be further adapted so that the fixed voltage value, which is maintained during at least one frequency range selection operation, is a mid-value of a maximum variation range for the VCO-control voltage.

In some embodiments, a start code value can be easily preloaded thanks to the digital control of the range selection by the digital loop filter, so that the automatic frequency range selection reaches the appropriate final frequency range more rapidly.

In some embodiments, the DCO controller may also be adapted for controlling, within the frequency range selection operation, a first loop bandwidth during a first operation phase and a second loop bandwidth during a second operation phase subsequent the first one, with the second loop bandwidth being narrower than the first loop bandwidth. In this manner, the frequency range convergence is further accelerated even if starting with an initial frequency range far from the final one as resulting from the converging process. In some embodiments, such loop bandwidth variation can be implemented on-the-fly during continuing operation of the invention DPLL device due to the digital nature of the loop filter.

In some embodiments, the DCO controller may be further adapted for adjusting, during the frequency range selection operation, at least one gain value relating to the time-to-digital converter, based on the code value which is currently delivered at the DCO-loop output of the digital loop filter. Accordingly, in some embodiments, the magnitude of the PLL-error signal can be kept within a substantially constant maximum variation range. Thus, the frequency range selection can be performed precisely whatever the initial frequency range at the start of the convergence process and the frequency ranges selected short before the end of the convergence process. In some embodiments, such gain adaptation for the time-to-digital converter can also be performed on-the-fly during the continuing operation of the invention DPLL device.

In some embodiments, the plurality of frequency ranges is obtained by varying a capacitance effective within the VCO module among several available values. In some embodiments, the multiband VCO module may comprise a VCO unit having a variable capacitor tank, where the variable capacitor tank is configured for producing the capacitance value based on the code value. Then, in some embodiments, the frequency range selected is set by the capacitance value of the capacitor tank.

In some embodiments, the capacitor tank may include several capacitor sub-ranks which are arranged in parallel with each other. Each capacitor sub-rank may be adapted for producing a respective capacitance value based on a code value which is dedicated to this capacitor sub-rank, thereby setting all together the total capacitance value of the whole capacitor tank. In some embodiments, all frequency ranges which are available for the same capacitor sub-rank (by varying the code value which is dedicated to the capacitor sub-rank) form a continuous total excursion range for this sub-rank, and the total excursion range for the immediately finer capacitor sub-rank is wider than the frequency range corresponding to one code step of this capacitor sub-rank. In some embodiments, the DCO controller may be further arranged for transmitting the respective code value to each one of the capacitor sub-ranks, and also for repeating the frequency range selection operation successively for each capacitor sub-rank which may be ranked from the coarsest to the finest, before initiating the analog VCO-tuning operation. Accordingly, in some embodiments, a multi-scale process is implemented for selecting the final frequency range so that this selection can handle final frequency ranges which are narrow, and a very stable analog PLL-operation may be obtained. In some embodiments, during the frequency range selection operation which is performed for one of the capacitor sub-ranks, a final code value already determined as corresponding to the meeting of the lock condition may be maintained for any one of the capacitor sub-ranks coarser than the capacitor sub-rank currently under frequency range selection. Simultaneously, a fixed code value may be maintained for any one of the capacitor sub-ranks which is finer than the capacitor sub-rank currently under frequency range selection. In some embodiments, this fixed code value may correspond substantially to a mid-value of the total excursion range of the capacitor sub-rank finer than that which is currently under frequency range selection.

In some embodiments, the phase jump caused within the outputted VCO signal upon switching between two frequency range selection operations, which are executed successively for different capacitor sub-ranks, is limited because the switching is performed digitally again.

In some embodiments, using successively at least two loop bandwidths within one frequency range selection operation may also apply to DPLL devices with multiple capacitor sub-ranks To this end, the at least one gain value which relates to the digital loop filter may be adjusted by the DCO controller based on the capacitor sub-rank currently under frequency range selection, and also based on the code value currently delivered at the DCO-loop output of the digital loop filter for this capacitor sub-rank. In this way, the loop bandwidth can be produced in accordance with the operation phase currently going on, for each frequency range selection operation. In some embodiments, the gain value relating to the digital loop filter may comprise a proportional gain value and an integral gain value. Because such adjustment is performed digitally, it may be implemented on-the-fly in accordance with the code value currently varied for the frequency range selection operation, without causing phase jumps. This applies whatever the sub-rank number within the capacitor tank, including a tank comprised of a single sub-rank.

In some embodiments, the DCO controller may be further adapted for disabling a low-pass filter function of the digital loop filter during the frequency range selection operation which relates to the coarsest one of the capacitor sub-ranks. Accordingly, in some embodiments, faster convergence of the frequency range selection may be obtained.

In some embodiments, the DCO controller may be further adapted for handling additional capacitance maximum and minimum values for each capacitor sub-rank other than the finest sub-rank. The additional capacitance maximum (resp. minimum) value thus implemented corresponds to a combination of the respective maximum (resp. minimum) capacitance values which are available for the capacitor sub-rank currently under frequency range selection and for each capacitor sub-rank finer than this latter. Then, these additional capacitance maximum and minimum values are available for being selected by the DCO controller during the frequency range selection operation currently executed. Accordingly, in some embodiments, faster convergence for the frequency range selection can thus be obtained for frequency values which are close to the limits of the total frequency range available.

In some embodiments, adjusting at least one gain value of the time-to-digital converter, may apply to DPLL devices with multiple capacitor sub-ranks too. Then, the gain adjustment may also be based on the capacitor sub-rank which is currently under frequency range selection, and also based on the code value which is currently delivered at the DCO-loop output of the digital loop filter for this capacitor sub-rank.

In some embodiments, several VCO units may be arranged in parallel and activated alternatively so as to obtain a total frequency range which is further increased. The multiband VCO module may include the plurality of VCO units, and the DCO controller is adapted for selecting one of the VCO units using the code value. In some embodiments, the VCO unit selected delivers the VCO signal at the output of the multiband VCO module.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings:

FIGS. 6a and 6b are a time-diagrams illustrating an operation according to both FIGS. 3 and 5 combined with each other.

Similar reference numbers which are indicated in different figures denote similar elements of elements with similar function. In addition, components with well-known functions and operation may not be described in detail.

DETAILED DESCRIPTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details.

Figure 1:
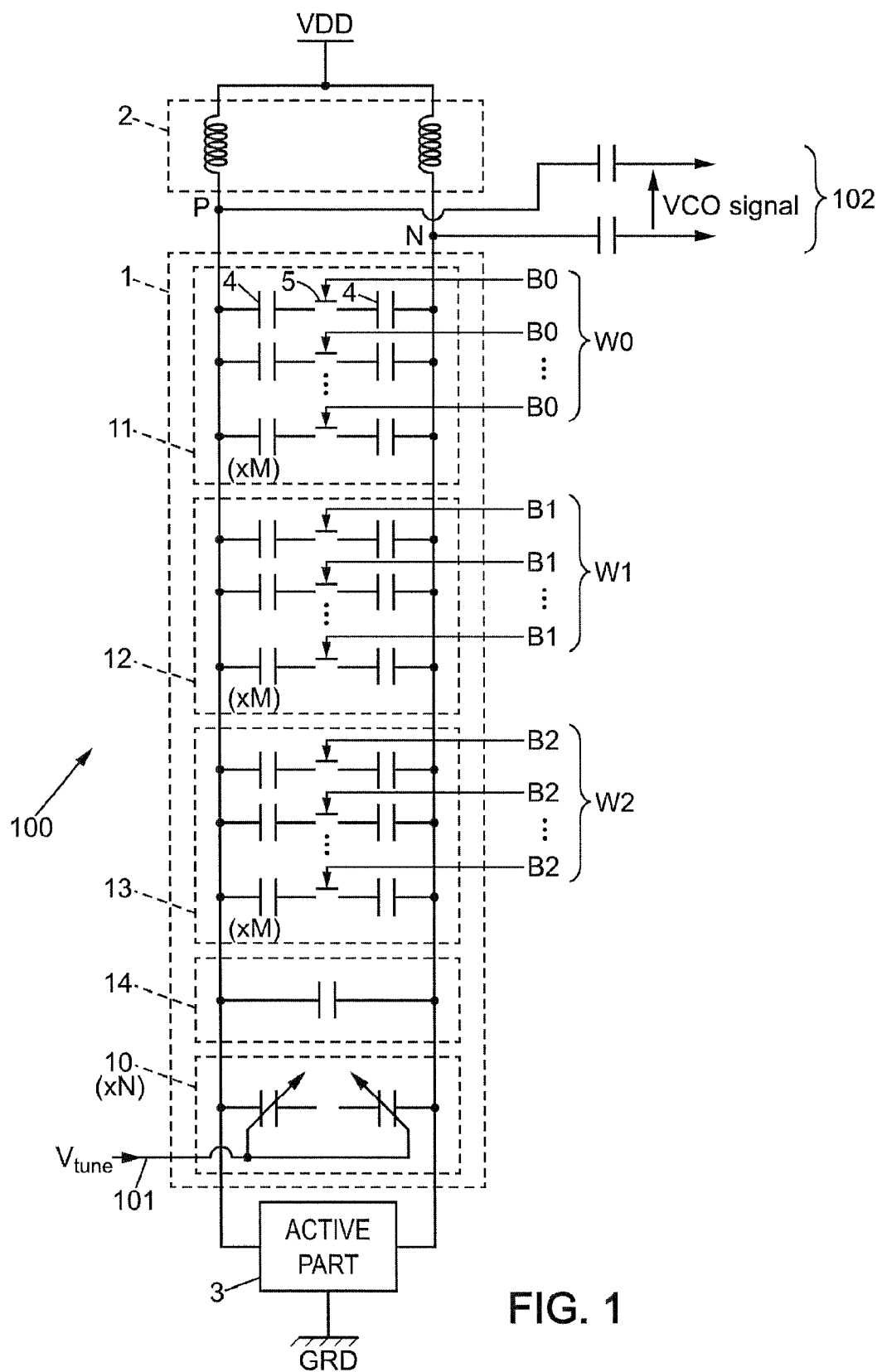
FIG. 1 is a block diagram of a multiband VCO module possibly used in embodiments.

In some embodiments, the multiband feature of the DPLL device results from using one multiband VCO module which is provided with digitally-controlled capacitor tank. FIG. 1 illustrates an exemplary general structure of such multiband VCO module, denoted 100 as a whole, and which may be of differential type for improved noise reduction. The VCO module 100 is comprised of a capacitor module 1, an inductor module 2 and an active part 3 all connected in parallel between two nodes P and N. The signal outputted by the VCO module 100 is then AC-voltage existing between both nodes P and N. Reference number 102 denotes the signal output of the VCO module 100.

The VCO module 100 is power-supplied between two reference terminals denoted GRD and VDD. The active part 3 compensates for energy losses that occur in the capacitor module 1 and the inductor module 2, so that the VCO signal is continuously delivered at output 102. In a known manner, the frequency of the VCO signal, denoted $F_{VCO}$, depends on a combination of the capacitance value of the capacitor module 1 and the inductance value of the inductor module 2. For example, the inductance value may be fixed.

In some embodiments, the capacitor module 1 is designed so that its capacitance value may be varied both analogically and digitally using an analog input 101 and digital inputs which are dedicated for being fed with respective input words W0, W1 and W2. To this end, the capacitor module 1 may be comprised of several branches all connected in parallel with each other, including N varactor branches 10, N being an integer, and a plurality of switchable capacitor branches. A direct voltage $V_{tune}$ which is applied at the analog input 101 allows controlling continuous variations of the capacitance value, in addition to a base capacitance value which is produced by the switchable capacitor branches.

In some embodiments, the switchable capacitor branches form a capacitor tank, which may be distributed into several capacitor sub-ranks, for example three capacitor sub-ranks 11, 12 and 13. The capacitor branches within one and same sub-rank may be all identical to each other, each including at least one capacitor 4 and a switch 5. The branch capacitance value is thus common to all branches pertaining to one same sub-rank, and the switch is arranged for activating or disabling the corresponding capacitor branch, based on the value of a control bit which is applied to the switch. Thus, all control bits B0 dedicated to capacitor branches of the sub-rank 11, form a digital word W0, denoted code value in the general part of this description. Similarly, all control bits B1 dedicated to the capacitor branches of the sub-rank 12 form another code value W1, and all control bits B2 which are dedicated to the capacitor branches of the sub-rank 13 form still another code value W2. If $C_{11}$ is the branch capacitance value of the individual branches of sub-rank 11, and idem with $C_{12}$ and $C_{13}$ respectively for sub-ranks 12 and 13, and M is the branch number per sub-rank, then the capacitor tank is designed so that the following conditions are met: $C_{11}>C_{12}>C_{13}$ and $C_{11}<M\times C_{12}$ and $C_{12}<M\times C_{13}$. Hence, $C_{11}$, $C_{12}$ and $C_{13}$ act as finite capacitance increments while forming a multi-scale capacitance setting structure. The code values W0, W1 and W2 then control the total capacitance value of the whole capacitor tank 1. Also, the total excursion of the capacitance value of the varactor branches 10 is at least equal to $C_{13}$. Although the present description relates to implementing three capacitor sub-ranks, the sub-rank number may be any one provided that conditions similar to above-recited are met.

Reference number 14 denotes at least one additional capacitor branch with fixed base capacitance value. Then, the respective variable capacitance values of the varactor branches 10 and capacitor sub-ranks 11 to 13 all add to this base capacitance value.

Figure 2:
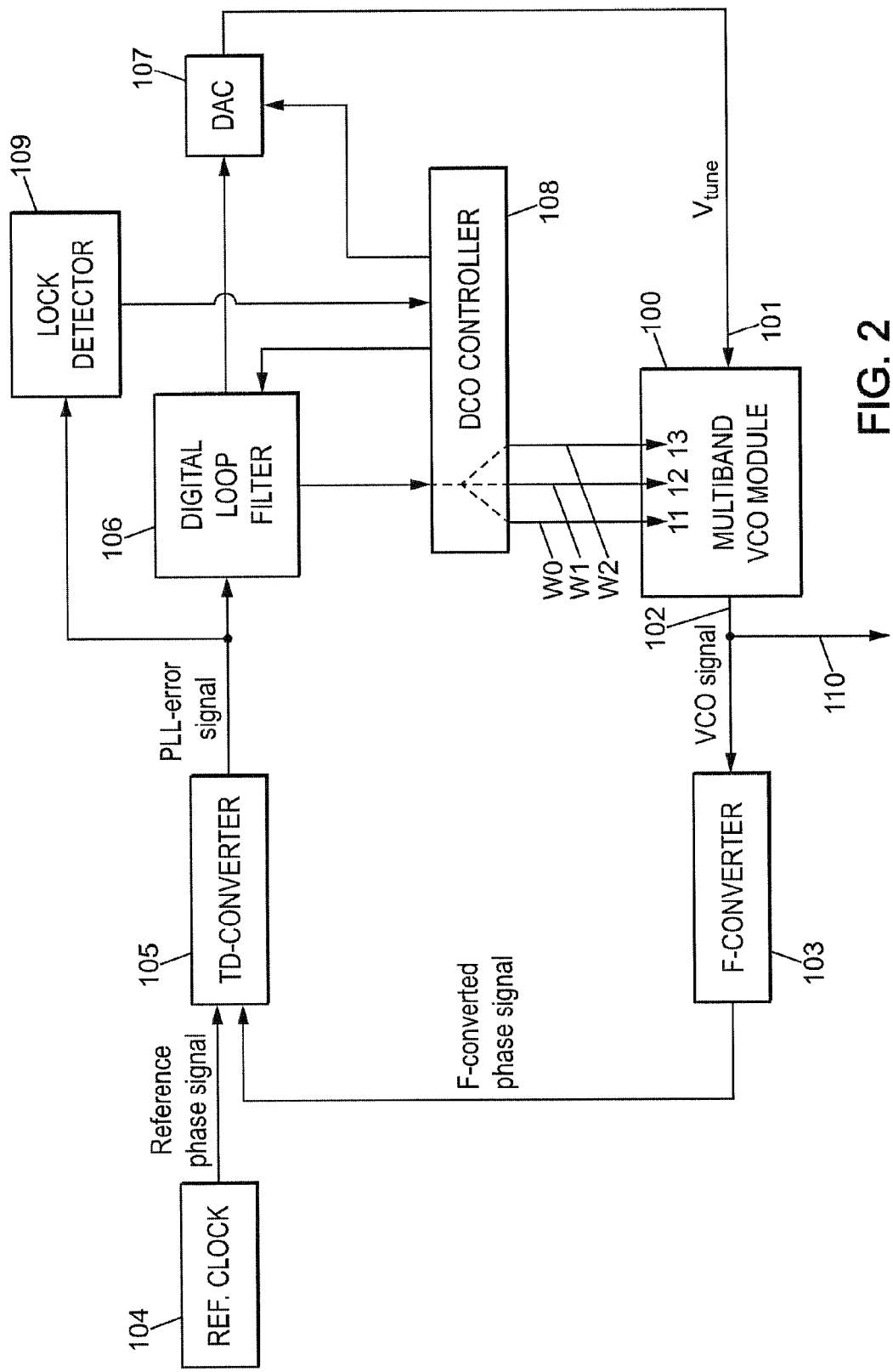
FIG. 2 is a simplified block diagram of a DPLL device incorporating a multiband VCO module according to FIG. 1.

In some embodiments, for the DPLL device shown in FIG. 2, the following reference numbers identify the respective element(s):
- 103 frequency converter denoted F-CONVERTER, for example a Q-divider with Q being the frequency division factor
- 104 reference clock, denoted REF. CLOCK and suitable for delivering a reference phase signal
- 105 time-to-digital converter denoted TD-CONVERTER
- 106 digital loop filter
- 107 digital-to-analog converter, denoted DAC
- 108 DCO controller
- 109 lock detector
- 110 signal output of the DPLL device The frequency converter 103 produces a derived phase signal, denoted F-converted phase signal, which is based on the VCO signal outputted by the VCO module 100, by Q-dividing the frequency of this latter. The time-to-digital converter 105 compares in real time the F-converted phase signal with the reference phase signal, so as to deliver a digital PLL-error signal which is representative of a difference between the respective phases of both F-converted and reference phase signals. The analog-equivalent function of the time-to-digital converter 105 is the well-known charge pump. The PLL-error signal is then filtered over time by the digital loop filter 106. The PLL-error signal from the time-to-digital converter 105 to the digital loop filter 106, and also the filtered PLL-error signal between the digital loop filter 106 and the digital-to-analog converter 107, are digital signals.

In some embodiments, the digital loop filter 106 is provided with a digital output, called DCO-loop output, for delivering a code value, and another VCO-loop output which is connected to the digital-to-analog converter 107. The digital-to-analog converter 107 produces the analog voltage $V_{tune}$ from the digital signal that it receives from the VCO-loop output of the digital loop filter 106. Alternatively, the voltage $V_{tune}$ may be forced by the DCO controller 108 to a predetermined fixed value. Preferably, this fixed value for the $V_{tune}$-voltage may correspond substantially to a mid-value within the total excursion range which is available for $V_{tune}$.

When the analog voltage $V_{tune}$ is forced to a fixed value, the DCO controller 108 forwards a code value which issued at the DCO-loop output of the digital loop filter 106 based on the filtered PLL-error signal, to only one of the capacitor sub-ranks 11, 12 and 13 of the VCO module 100. The code value thus forwarded forms the digital word W0, W1 or W2 in the embodiment currently described, depending on the capacitor sub-rank 11, 12 and 13 to which the code value is intended. For this reason, DCO stands for digitally-controlled oscillator. When the DCO controller 108 thus supplies one of the capacitor sub-ranks with a word based on the filtered PLL-error signal, the respective words for the other capacitor sub-ranks are forced at the same time to constant values, as well as the analog voltage $V_{tune}$.

A connection may also be provided from the DCO controller 108 back to the digital loop filter 106, for the DCO controller to set configuration parameters of the filter depending on the operation step currently executed. At least part of the digital loop filter 106 being a proportional integral filter, these configuration parameters may include values for a proportional coefficient denoted $K_i$ later below, and an integral coefficient denoted $K_p$. If another part of the digital loop filter 106 forms a low-pass filter, then the configuration parameters of the filter which are set by the DCO controller 108 for each operation step may further include at least one value $K_{LP}$ for a low-pass filter gain.

When the DCO controller 108 forces transmission of code values W0, W1 and W2 which are all constant over time and allows that the $V_{tune}$-voltage is produced by the digital-to-analog converter 107 based on the filtered PLL-error signal, then the operation is the usual one for a DPLL, as commonly known.

Figure 3:
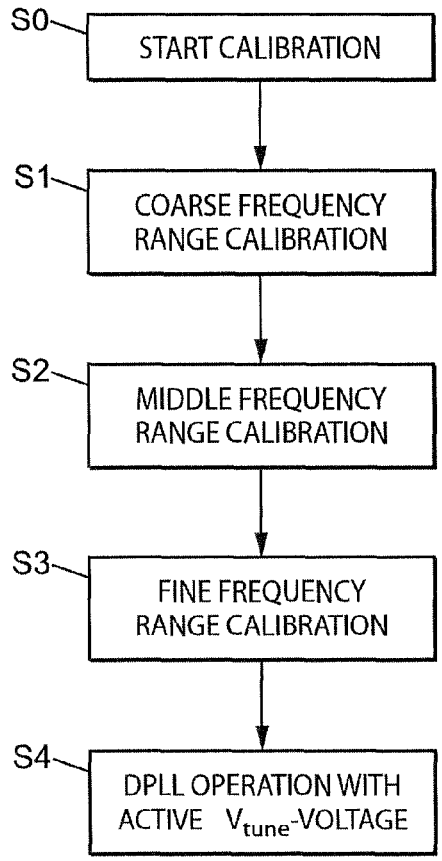
FIG. 3 is an overview diagram of a multi-scale frequency range selection operation implemented in a DPLL device according to FIG. 2.

A general overview of the operation of the DPLL with automatic frequency range selection is now provided with reference to FIG. 3, although a more complete description of such operation with possible refinements will be provided later on.

At initial step S0, the digital code values W0, W1 and W2 may be each set to mid-range initial values and the $V_{tune}$-voltage may be set to mid-range analog value.

Step S1 is dedicated to coarse frequency range selection by adjusting the capacitance value of the capacitor sub-rank 11, using the code value W0. The code values W1 and W2 as well as $V_{tune}$-voltage are kept fixed at their respective initial values from step S0. The code value W0 is the feedback parameter of the active loop comprised of the VCO module 100, the frequency converter 103, the time-to-digital converter 105 and the digital loop filter 106. Step S1 is controlled by the DCO controller 108 by transmitting to the VCO module 100 the code value W0 as produced by the digital loop filter 106, and by forcing the W1-, W2- and $V_{tune}$-values as just indicated. Convergence of the code value W0 to a final state is detected by the lock detector 109 in a manner that will be described later on, and the lock detector 109 then sends a signal to the DCO controller 108 so that this latter triggers step S2.

Then, step S2 is dedicated to middle frequency range selection by adjusting the capacitance value of the capacitor sub-rank 12, using the code value W1. The code value W0 is forced to its final value as resulting from step S1, but it would remain at this value per se. The code value W2 as well as $V_{tune}$-voltage are again kept fixed at their respective initial values from step S0. Thus, the code value W1 is now the feedback parameter of the same active loop as in step S1. Step S2 is controlled by the DCO controller 108 by transmitting to the VCO module 100 the code value W1 as produced by the digital loop filter 106, and by forcing the W0-, W2- and $V_{tune}$-values as just indicated. Convergence of the code value W1 to a final state is detected by the lock detector 109, and this latter then sends a signal to the DCO controller 108 for going on with step S3.

Thereafter, step S3 is dedicated to fine frequency range selection by adjusting the capacitance value of the capacitor sub-rank 13, using the code value W2. The code values W0 and W1 are forced to their respective final values as resulting from steps S1 and S2, although they would remain at these values per se. The $V_{tune}$-voltage is still kept fixed at its initial value. Thus, the code value W2 is the feedback parameter of the same active loop as in steps S1 and S2. Step S3 is controlled by the DCO controller 108 by transmitting to the VCO module 100 the code value W2 as produced by the digital loop filter 106, and by forcing the W0-, W1- and $V_{tune}$-values as just indicated. Convergence of the code value W2 to a final state is detected by the lock detector 109, and this latter then sends a signal to the DCO controller 108 for going on with step S4.

Finally, step S4 corresponds to the normal operation of the DPLL with the $V_{tune}$-voltage being the active parameter. The code values W0, W1 and W2 are forced to their respective final values as resulting from steps S1, S2 and S3, although they would remain at these values per se. Step S4 is controlled by the DCO controller 108 by allowing transmission to the digital-to-analog converter 107 the filtered PLL-error signal as produced by the digital loop filter 106, and by forcing the W0-, W1- and W2 values as just indicated. In case the lock detector 109 alerts the DCO controller 108 to lock condition no longer met for any reason, the process may be repeated from one of the steps S0 to S3. But actually, if previous steps S0 to S3 have been successfully performed, then step S4 should be successful too as long as appropriate configuration parameters are selected for the digital loop filter 106. All steps S0 to S4 are to be started over when a new value for the division factor Q is programmed into the frequency converter 103.

In some embodiments, however, convergence of the W0-, W1- and W2-code values may be slower using steps S1, S2 and S3 as described above, when the final VCO frequency is near one of the upper and lower limits of the overall frequency range. This occurs more specifically when the final capacitance value is comprised between $M \cdot C_{11}+(C_{12}+C_{13}) \cdot M/2$ and the maximum capacitance value $M \cdot (C_{11}+C_{12}+C_{13})$, and also symmetrically from the minimum capacitance value. Indeed, implementing step S1 as described leads to the value $M \cdot (C_{11}+C_{12}+C_{13})$ not being available during this step S1. One refinement for alleviating this drawback consists in adding the maximum capacitance value $M \cdot (C_{11}+C_{12}+C_{13})$ and the minimum zero value for the total variable part of the capacitance, to the capacitance values $W0 \cdot C_{11}+(C_{12}+C_{13}) \cdot M/2$ which are already available during step S1. Similarly for step S2, $W0_{final} \cdot C_{11}+M \cdot (C_{12}+C_{13})$ and $W0_{final} \cdot C_{11}$ are added to the capacitance values $W0_{final} \cdot C_{11}+W1 \cdot C_{12}+C_{13} \cdot M/2$ which are already available, where $W0_{final}$ is i the W0-code value as resulting from step S1. Actually, these additional capacitance values introduced for steps S1 and S2 appear as exceptions with respect to maintaining fixedly the code values relating to capacitor sub-ranks finer than that which is currently under frequency range selection.

In some embodiments, when the digital loop filter 106 implements a first filter function of proportional-integral type in combination with a second filter function of low-pass type, it is possible to disable the low-pass filter function within the digital loop filter 106 for speeding up convergence. Such disabling of the low-pass filter function may be forced by the DCO controller 108 during the steps S1 to S3, and the low-pass filter function is enabled again for the step S4. Indeed, steps S1 to S3 should preferably be fast, but not necessary low-noise. Only step S4 is most preferably low-noise, in order to reach the final required performance which corresponds to using a narrow loop bandwidth together with the low-pass filter function.

Figure 4:
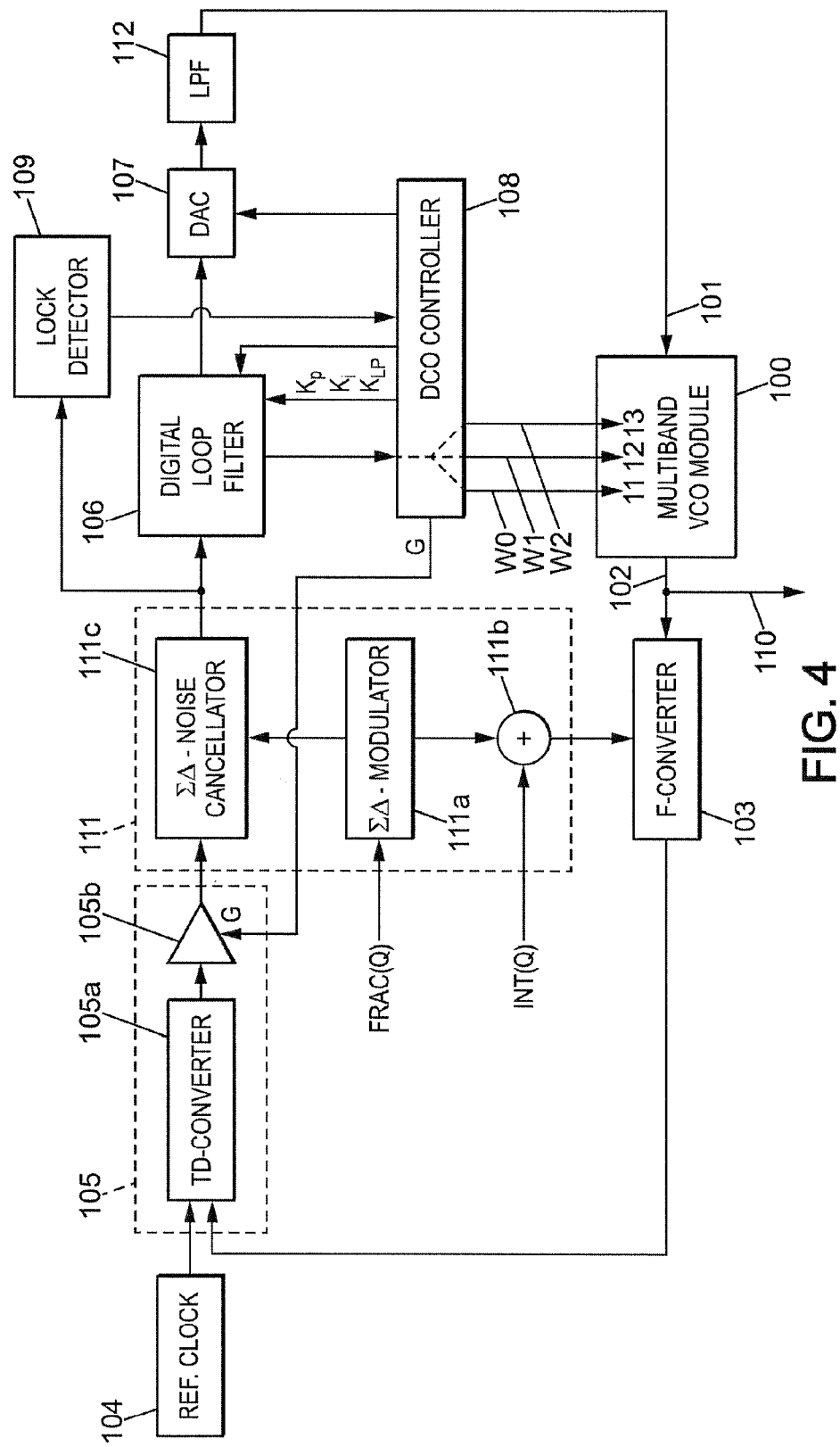
FIG. 4 corresponds to FIG. 2 with additional modules corresponding to optional embodiment refinements.

The exemplary DPLL device shown in FIG. 4 includes a gain adjustment for steps S1 to S3 and a possibly non-integer Q-division factor.

In some embodiments, the sensitivity of the VCO frequency variations which are produced during the steps S1 to S3 based on the PLL-error signal, varies itself depending on the step S1, S2 or S3 currently going on, but also depending on the frequency range which is identified by the code value currently produced by the digital loop filter 106. For example, the increase in the VCO frequency may be 150 MHz (megahertz) when the W0-code value is switched from 0 to 1, and about 190-200 MHz when the W0-code value is switched from 7 to 8. These sensitivity variations may be compensated for by multiplying the PLL-error signal as delivered by the time-to-digital converter 105 by an appropriate gain value denoted G. This gain value may be stored and sent by the DCO controller 108 to a digital signal elevator which is arranged at the output of the time-to-digital converter. Reference number 105 denotes the time-to-digital converter module thus resulting, including the TD-converter itself now labelled 105a, and the signal elevator labelled 105b. Hence, the sensitivity of the VCO frequency variations with respect to the PLL-error signal can be kept almost constant.

In some embodiments, independently, module set 111 allows implementing a non-integer Q-division factor for the frequency converter 103. To this end, the fractional part FRAC(Q) of the Q-division factor is introduced using a sigma-delta modulator 111a, denoted $\Sigma\Delta$-MODULATOR. Then, the modulation signal which is delivered by this $\Sigma\Delta$-modulator 111a is added to the constant integer part INT(Q) of the same Q-division factor using an adder 111b. The addition result is used as an instant division factor which is implemented by the frequency converter 103. A $\Sigma\Delta$-noise cancellator 111c is also used between the time-to-digital converter 105 and the digital loop filter 106 for reducing or suppressing the signal noise which is produced by the $\Sigma\Delta$-modulation.

In some embodiments, in addition, an analog low-pass filter 112 denoted LPF may optionally be added downstream the digital-to-analog converter 107, for avoiding the noise this converter 107 propagates to the analog input 101 of the VCO module 100.

Figure 5:
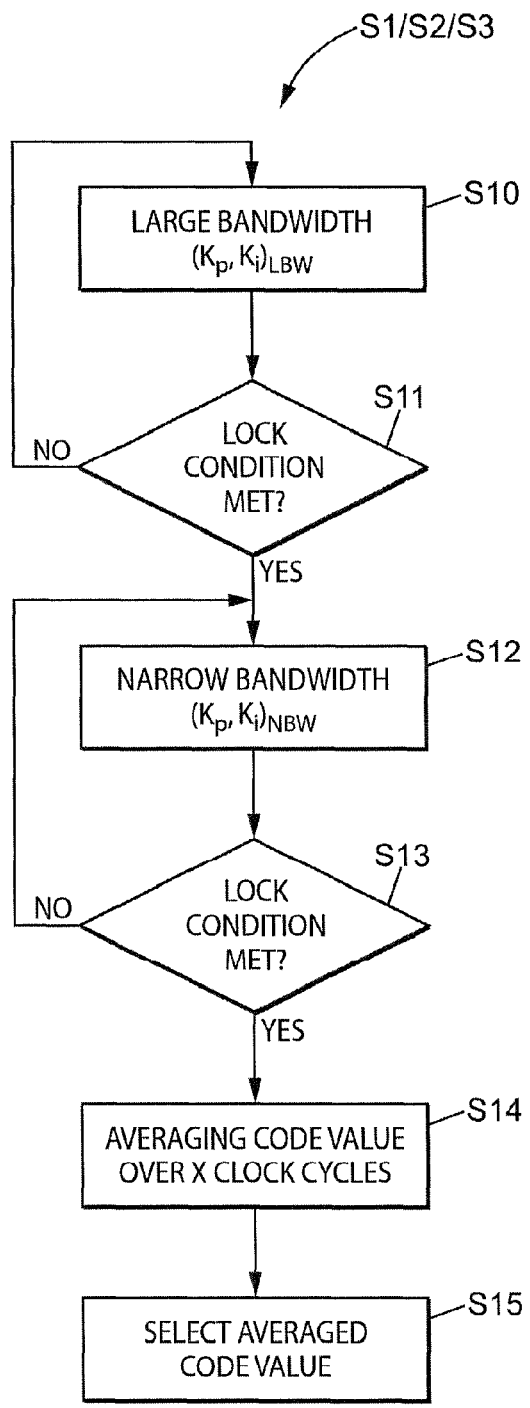
FIG. 5 is a block diagram for a frequency range selection operation as implemented in a DPLL device according to FIG. 4.

With reference to FIG. 5, still another refinement of the exemplary DPLL device allows accelerating each step S1 to S3. Although Step S1 will used for explanation, in some embodiments the same applies to steps S2 and S3. For the purpose of speeding up the convergence of the code value sent to the corresponding capacitor sub-rank, the code value is adjusted using successively two loop bandwidth values different from each other. In substep S10, a large loop bandwidth value LBW is first implemented by the DCO controller 108 within the active loop comprised of the VCO module 100, the frequency converter 103, the time-to-digital converter 105 and the digital loop filter 106, for allowing large variations of the code value. Operation with this large loop bandwidth value LBW is continued until a PLL-lock state is detected. Such detection implements testing a lock condition in substep S11. Once PLL-lock state is detected in this way, a narrow loop bandwidth value NBW which is less than the loop bandwidth value LBW, is controlled by the DCO controller 108 during substep S12 for avoiding that the code value may oscillate. No phase jump is caused within the outputted VCO signal between the operations with large and narrow bandwidth values, because the loop bandwidth switching is performed digitally within the digital loop filter 106. Such variation in the loop bandwidth further accelerates the convergence of each code value to its final value. Possibly, additional substeps may be further implemented for reducing the loop bandwidth more progressively.

To this purpose, proportional and integral gain coefficients $K_p$ and $K_i$ of the digital loop filter 106 may be adjusted differently during both substeps S10 and S12, with value pair $(K_p, K_i)_{LBW}$ for substep S10 and value pair $(K_p, K_i)_{NBW}$ for substep S12. In some embodiments, one of ordinary skill in the art will be able to select such value pairs appropriately for obtaining the desired bandwidth value. Such setting of the gain values, in particular of the $K_i$ value, further accelerates the convergence of each code value toward its final value.

Substeps S11 and S13 may be identical and are performed by the lock detector 109 whatever the number of bandwidth values successively implemented, including a single one. They consist each in checking that the lock condition is currently met or not, based on the last values of the PLL-error signal which have been successively produced by the time-to-digital converter 105 during a test time-interval of Y clock cycles, Y being an integer. Such lock condition may be, for example, that the PLL-error signal variations remain below a predetermined threshold during the Y clock cycles. If the lock condition is not met, at least part of the frequency range selection may be executed again, until PLL lock is detected by lock condition positively checked. Then in substep S14, a time-averaged code value is calculated over the last X clock cycles, X being an integer. This calculation may be performed by integrating the DCO-loop output of the digital loop filter 106 over the X last clock cycles, and dividing by X. For example, Y may equal 60 and X may equal 16. The time-averaged code value is applied to the corresponding capacitor sub-rank in substep S15, and is maintained continually from then.

FIGS. 6a and 6b are two time-diagrams corresponding to a same automatic operation of a DPLL device provided with all the refinements just described. They are to be read with vertical correspondence between both diagrams. X-coordinate of both diagrams is time expressed in second unit. Y-coordinate in FIG. 6a is successively the code values W0, W1, W2 and the analog voltage $V_{tune}$ in arbitrary units (a.u.). Y-coordinate in FIG. 6b is the PLL-error signal at the output of the time-to-digital converter 105, also in arbitrary units. These diagrams show the correlation of the successive variations of the code values W0, W1 and W2, with the variations of the PLL-error during the steps S1 to S3 and substeps S10, S12 and S14 each time. The time-variations of the analog $V_{tune}$-voltage are also shown in FIG. 6a, with constant $V_{tune}$-value over the total duration of steps S1 to S3.

Figure 7:
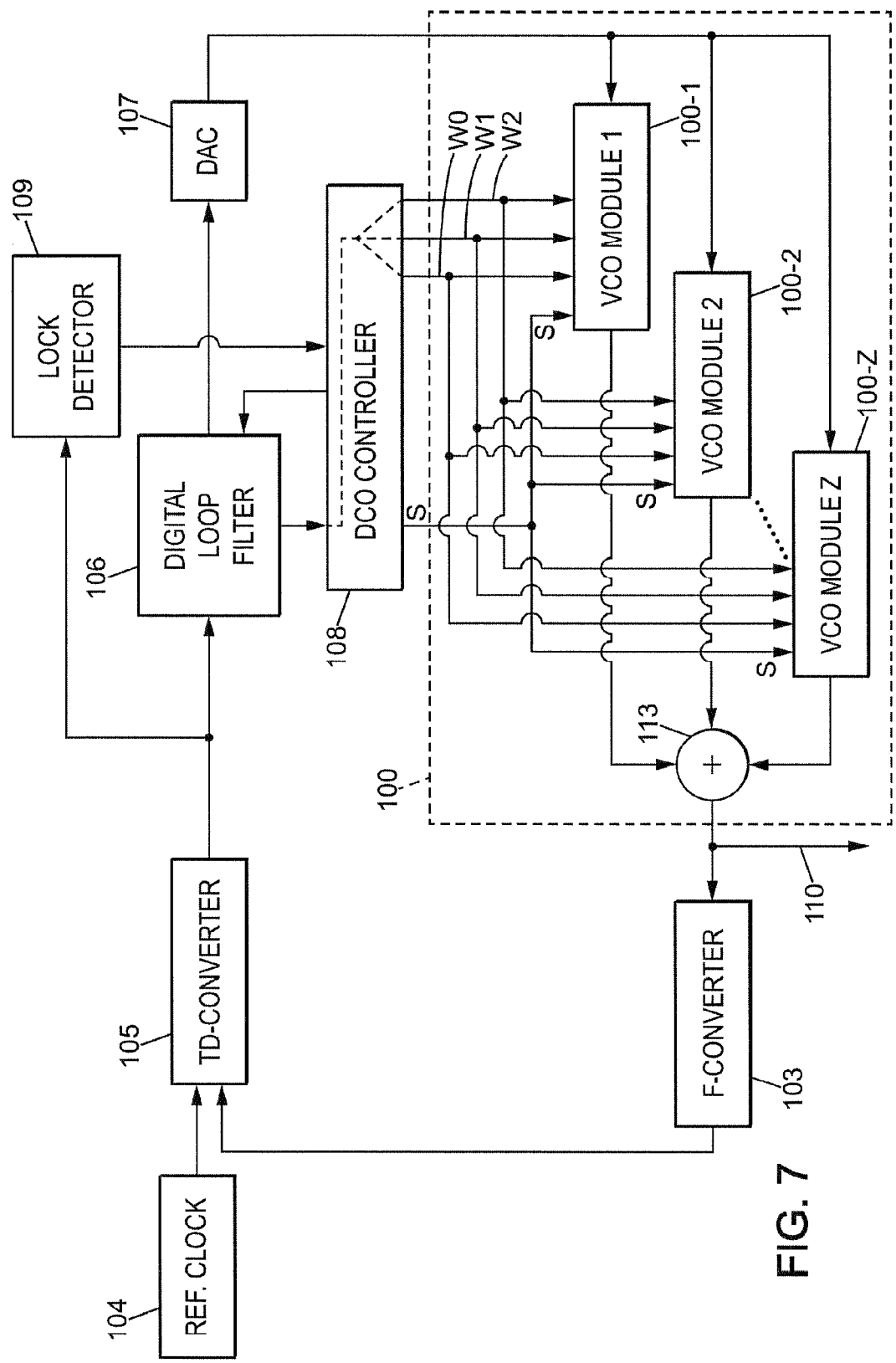
FIG. 7 is a block diagram of several multiband VCO devices using one PLL according to another embodiment.

FIG. 7 relates to another invention embodiment where the DPLL device is provided with several multiband VCO units in parallel. These VCO units are labelled 100-1, 10-2 . . . , 100-Z, Z being an integer greater than unity, and each designed for providing a respective total excursion range for the frequency of the VCO signal. All frequency ranges thus provided are supposed to be next to one another with overlaps or common limits between any two successive ranges. For ensuring that no gap exists between two successive ranges despite manufacturing deviations which may possibly occur, range overlaps are preferably provided initially. Switching from one VCO unit to another one is controlled by the DCO controller 108 with a selection signal S, thereby enabling only one of the VCO units at a same time and disabling the others. Such selection of one of the VCO units may be based on the value of the division factor Q which is currently implemented within the frequency converter 103. Reference number 113 is an adder arranged for sending the VCO signal which is outputted by any one of the VCO units to the frequency converter 103. The adder 113 together with the VCO units 100-1, 100-2 . . . , 100-Z have the same function as the VCO module 100 in the first invention embodiment. In particular, when it is selected for producing the VCO signal, any of the VCO units is fed with the code value or values and the VCO-control voltage as described earlier.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

The invention claimed is:

1. A digital phase-locked loop (DPLL) device with automatic frequency range selection, comprising:
  a multiband voltage-controlled oscillator (VCO) module comprising
    an output configured to deliver a VCO signal with a VCO frequency pertaining to one frequency range selected among several frequency ranges;
    at least one digital input configured to select the frequency range based on a code value received at the digital input; and
    an analog input configured to receive a VCO-control voltage so each value for the VCO frequency within the frequency range selected is produced for one value of the VCO-control voltage;
  a frequency converter configured to connect with the VCO signal and to output a phase signal derived from the VCO signal by Q-dividing the VCO frequency, wherein Q is a non-zero division factor;
  a time-to-digital converter comprising a first input to receive a reference phase signal from a reference clock, and a second input to receive the phase signal outputted by the frequency converter, and an output to deliver a digital PLL-error signal;
  a digital loop filter comprising
    an input connected to the output of the time-to-digital converter; and
    a VCO-loop output to deliver a digital VCO-control signal based on filtering of the digital PLL-error signal as received at the input of the digital loop filter;
  a digital-to-analog converter connected at an input to the VCO-loop output of the digital loop filter, and connected at an output to the analog input of the multiband VCO module, to produce the VCO-control voltage based on the digital VCO-control signal;
  wherein the digital loop filter further has a DCO-loop output suitable for delivering the code value based on a filtering of the digital PLL-error signal as received at the input of the digital loop filter;
  and wherein the DPLL device further comprises
    a lock detector configured to detect from the digital PLL-error signal whether a lock condition of the DPLL device is met; and
    a DCO controller configured to transmit the code value to the digital input of the multiband VCO module, and to control several successive operations of the DPLL device, comprising
      at least one frequency range selection operation where the VCO-control voltage is maintained at fixed voltage value and the code value varies until the lock condition is met; and
      an analog VCO-tuning operation where a final code value corresponding to the meeting of the lock condition is maintained at the digital input of the multiband VCO module and the digital VCO-control signal varies so as to maintain the lock condition.

2. The DPLL device of claim 1, wherein the DCO controller is further configured so that the fixed voltage value which is maintained during the at least one frequency range selection operation is a mid-value of a maximum variation range for the VCO-control voltage.

3. The DPLL device of claim 1, wherein the DCO controller is further configured to control, within the frequency range selection operation, a first loop bandwidth during a first operation phase and a second loop bandwidth during a second operation phase subsequent the first operation phase, the second loop bandwidth being narrower than the first loop bandwidth.

4. The DPLL device of claim 1, wherein the DCO controller is further configured to adjust, during the frequency range selection operation, a gain value relating to the time-to-digital converter based on the code value currently delivered at the DCO-loop output of the digital loop filter.

5. The DPLL device of claim 1, wherein the multiband VCO module comprises a VCO unit having a variable capacitor tank, the capacitor tank being configured to produce a capacitance value based on the code value, and the frequency range selected being set by the capacitance value of the capacitor tank.

6. The DPLL device of claim 5, wherein the capacitor tank comprises several capacitor sub-ranks arranged in parallel with each other,
wherein each capacitor sub-rank is configured to produce a respective capacitance value based on a code value dedicated to the capacitor sub-rank, thereby setting the capacitance value of the capacitor tank and all frequency ranges available by varying the code value dedicated to the same capacitor sub-rank forming a continuous total excursion range for this sub-rank, wherein the total excursion range for the immediately finer capacitor sub-rank being wider than the frequency range corresponding to one code step of this capacitor sub-rank,
wherein the DCO controller is further configured to transmit the respective code value to each one of the capacitor sub-ranks,
wherein the DCO controller is further configured to repeat the frequency range selection operation successively for each capacitor sub-rank ranked from the coarsest one to the finest one, before initiating the analog VCO-tuning operation,
and wherein during the frequency range selection operation executed for one of the capacitor sub-ranks, a final code value already determined as corresponding to the meeting of the lock condition is maintained for any one of the capacitor sub-ranks coarser than the capacitor sub-rank currently under frequency range selection, and a fixed code value is maintained for any one of the capacitor sub-ranks finer than the capacitor sub-rank currently under frequency range selection.

7. The DPLL device of claim 6 wherein, during the frequency range selection operation executed for one of the capacitor sub-ranks, the fixed code value which is maintained for any one of the capacitor sub-ranks finer than the capacitor sub-rank currently under frequency range selection, corresponds substantially to a mid-value of the total excursion range of the capacitor sub-rank finer than the capacitor sub-rank currently under frequency range selection.

8. The DPLL device of claim 6, wherein the DCO controller is further configured to control, within the frequency range selection operation executed for each one of the capacitor sub-ranks, a first loop bandwidth during a first operation phase and a second loop bandwidth during a second operation phase subsequent the first operation phase, the second loop bandwidth being narrower than the first loop bandwidth.

9. The DPLL device of claim 8, wherein the DCO controller is further configured to adjust, for each operation phase within the frequency range selection operation executed for each one of the capacitor sub-ranks, at least one gain value relating to the digital loop filter based on the capacitor sub-rank currently under frequency range selection, and based on the code value currently delivered at the DCO-loop output of the digital loop filter for the capacitor sub-rank, so as to produce the corresponding first or second loop bandwidth.

10. The DPLL device of claim 9, wherein the at least one gain value comprises a proportional gain value and an integral gain value.

11. The DPLL device of claim 6, wherein the DCO controller is further configured to disable a low-pass filter function of the digital loop filter during the frequency range selection operation relating to the coarsest one of the capacitor sub-ranks.

12. The DPLL device of claim 6, wherein the DCO controller is further configured to handle additional capacitance maximum and minimum values for each capacitor sub-rank other than the finest sub-rank,
the additional capacitance maximum value corresponding to a combination of the respective maximum capacitance values available for the capacitor sub-rank currently under frequency range selection and each capacitor sub-rank finer than the capacitor sub-rank currently under frequency range selection,
the additional capacitance minimum value corresponding to a combination of the respective minimum capacitance values available for the capacitor sub-rank currently under frequency range selection and each capacitor sub-rank finer than the capacitor sub-rank currently under frequency range selection,
and the additional capacitance maximum and minimum values are available for being selected by the DCO controller during the frequency range selection operation currently executed.

13. The DPLL device of claim 6, wherein the DCO controller is further configured to adjust, during the frequency range selection operation, a gain value relating to the time-to-digital converter based on the code value currently delivered at the DCO-loop output of the digital loop filter and also on the capacitor sub-rank currently under frequency range selection.

14. The DPLL device of claim 1, wherein the multiband VCO module comprises several VCO units, and the DCO controller is further configured to select one of the VCO units so that the VCO unit selected delivers the VCO signal at the output of the multiband VCO module.

* * * * *